RESET TIME COMPENSATOR FOR FREQUENCY CONVERTER

Filed Feb. 29, 1968

*INVENTOR.*
ANTHONY M. DEMARK
BY J. Donald Weber Jr.
ATTORNEY.

United States Patent Office 3,564,428

Patented Feb. 16, 1971

3,564,428
RESET TIME COMPENSATOR FOR FREQUENCY CONVERTER

Anthony M. Demark, Philadelphia, Pa., assignor to Honeywell Inc., Minneapolis, Minn., a corporation of Delaware Filed Feb. 29, 1968, Ser. No. 709,446
Int. Cl. G06g *7/18;* H03k *5/00*
U.S. Cl. 328—127 3 Claims

ABSTRACT OF THE DISCLOSURE

There is provided a voltage to frequency converter which includes an integrating amplifier having a capacitor feedback path. Impedance means are included in the feedback path to provide an offset voltage which is directly proportional to the input voltage such that the capacitor reset time is compensated.

In the electronic industry in general, and the computer industry in particular, there are many uses for a voltage to frequency converter which is linear in operation. Many voltage to frequency oscillators are known in the art. However, these converters suffer from a lack of linearity over wide frequency ranges.

A typical voltage to frequency converter includes an integrating device or the like which provides a ramp-type signal in response to an input signal. When the ramp signal achieves a predetermined level, the system is reset and the ramp signal is re-initiated. The difficulties with this type of circuit are that the integrating amplifier usually includes a capacitor which must be reset to zero prior to the initiation of a succeeding ramp signal. Obviously, the capacitor requires a finite time to be discharged and, moreover operating delays are built in to assure that the capacitor is completely discharged. These delays and finite operational times cause or contribute to the nonlinearity of the system. That is, at relatively low frequency ranges, the discharge time constant for the capacitor may be a very small relative percentage of the signal or cycle time. However, since the discharge time is substantially constant, an increase in frequency on the order of 10 will produce a more pronounced error in linearity, due to the capacitor discharge time. If the frequency range varies by 100 or 1,000 to 1, the linearity error is commensurately more significant.

Consequently, circuits have been designed to offset or compensate for this nonlinearity. Typically, the ramp signal is offset by a predetermined amount. In the prior art, the offset signal is supplied by means of an additional amplifier in parallel with the integrating amplifier which provides a pedestal or offset voltage at the output of the ramp amplifier. However, this device is relatively expensive inasmuch as a second amplifier circuit and the attendant interconnections associated therewith are required. In other words, two amplifier circuits are required to perform a function which could be, ideally, performed by a single amplifier.

Consequently, the subject invention becomes quite advantageous inasmuch as a single amplifier is used to generate a compensated ramp signal. An additional impedance is included in the feedback path of the amplifier in such a manner s to provide an offset voltage without adversely affecting the discharge time of the integrating capacitor in the feedback path. This offset voltage is directly proportional to the input signal whereby the offset voltage varies as the input voltage varies.

Consequently it is one object of this invention to provide a voltage to frequency converter.

It is another object of this invention to provide a voltage to frequency converter which includes compensating means to avoid reset time affect.

It is another object of this invention to provide a voltage to frequency converter which exhibits linear operation over wide ranges of frequency.

Another object of this invention is to provide reset time compensation for a voltage to frequency converter which is relatively simple and inexpensive to manufacture.

These and other objects and advantages of the subject invention will become readily apparent when the following description is read in conjunction with the drawings, in which.

Figure 1:
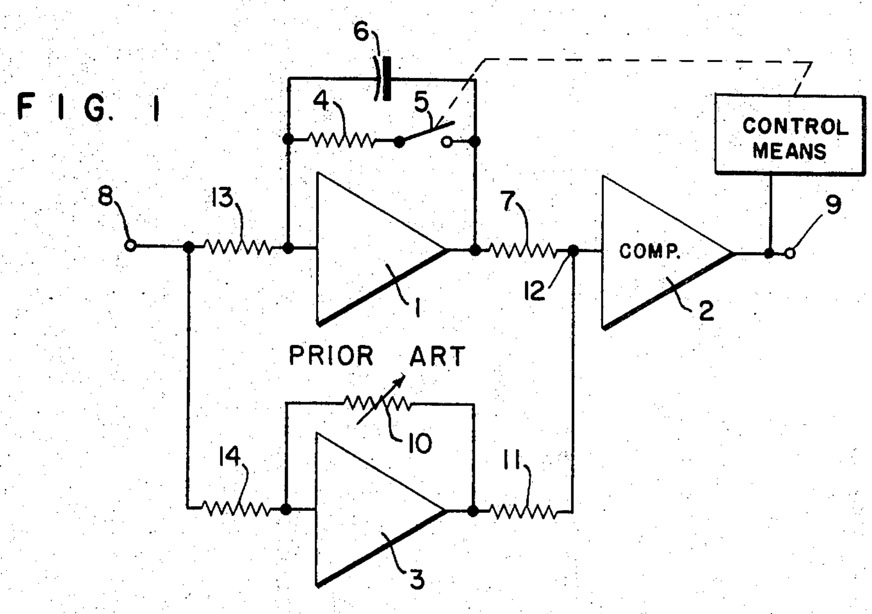
FIG. 1 is a schematic diagram of a compensated amplifier known in the art.

Referring now to FIG. 1, there is shown a schematic diagram of a reset time compensator for a voltage to frequency converter which is known in the prior art. Such a compensating network is shown and described in the copending application of W. H. Crowell, entitled Time Division Multiplier, bearing Ser. No. 675,596, filed on Oct. 16, 1967 and assigned to a common assignee. Specifically, in the circuit shown in FIG. 1, input terminal 8 is connected via resistor 13 to an input of amplifier 1 and via resistor 14 to an input of ampilfier 3. Capacitor 6 is connected in parallel with amplifier 1 to produce an integrating amplifier. The series combination of resistor 4 and normally open switch 5 is connected in parallel with capacitor 6. Switch 5 is selectively closed as will be hereinafter described, to reset and discharge capacitor 6 such that amplifier 1 can subsequently begin another cycle. Resistor 4 is used primarily for current suppression to avoid burning out the contacts of switch 5. A variable resistor 10 is connected in parallel with amplifier 3 to control the gain function thereof. Typically, the gain of amplifier 3 is controlled to be in the range of 0 to 0.2.

The output of amplifier 1 is connected via resistor 7 to common junction 12. The output of amplifier 3 is connected via resistor 11 to common junction 12. The signals supplied via resistors 7 and 11 are summed at junction 12 and applied to comparator 2. Comparator 2 may be any suitable type of comparing device which produces an output signal in the form of a level change at terminal 9 upon a predetermined signal relationship at the input thereof. For example, a reference signal may be supplied internally of comparator 2. When the signals supplied via resistors 7 and 11 are cumulatively supplied, comparator 2 produces an output level change when the input signal equals the reference signal. The signal level change at output terminal 9 is, inter alia, applied to a coil or the like (not shown) which causes switch 5 to close, thereby shorting capacitor 6 and discharging same. The closure of switch 5 operates to reset capacitor 6 to the initial condition and, as well, maintain amplifier 1 in a nonoperative condition while awaiting the removal of the short circuit across capacitor 6. The discharge time for capacitor 6 is a function of the value of resistor 4.

Thus, a signal is supplied to amplifier 1 from terminal 8. Amplifier 1 when connected as an integrator begins to produce a ramp type signal. In addition, the signal at terminal 8 is applied to amplifier 3. Amplifier 3 operates upon the input signal and supplies a substantially constant signal at junction 12. It is clear that the signal produced by amplifier 1 is added to the signal supplied by amplifier 3 and an offset ramp signal is produced. The offset ramp signal is supplied to compartor 2 and causes comparator 2 to trigger prematurely relative to the ramp signal supplied by amplifier 1 alone. That is, the time constant for the discharging of capacitor 6 (including a safeguard time period) is calculated. The voltage level which will be obtained by the ramp output signal during the discharge time is also computed. Amplifier 3 is adjusted to provide a proper gain function so that the proportion of the input signal supplied via resistor 11, i.e. the pedestal voltage, is substantially equal to the aforesaid voltage which could be generated by the ramp or integrating amplifier 1 during a typical time constant. Consequently, comparator 2 fires or triggers before the ramp signal actually reaches the comparison level and causes the integrating capacitor to be short circuited due to closure of switch 5. However, comparator 2 is triggered a time period identical to the discharge time prior to the actual ramp time whereby the ramp frequency is not altered. Short circuiting capacitor 6 terminates the operation of the integrator, permits discharge of capacitor 6 and initialization of amplifier 1 during a "dead-time." Meanwhile, the pedestal voltage is still applied to junction 12 via amplifier 3. This pedestal voltage is insufficient to trigger comparator 2 whereupon switch 5 again opens and the integrating action resumes, from zero, but the output signal, as noted, is superimposed upon the pedestal voltage.

This circuit operates satisfactorily to perform the desired function. However, as noted, two amplifiers are required in order to produce a single integrating amplifier which is reasonably accurate and linear. In applications where an iterative type of voltage to frequency converter is required, the additional cost may be prohibitive.

Figure 2:
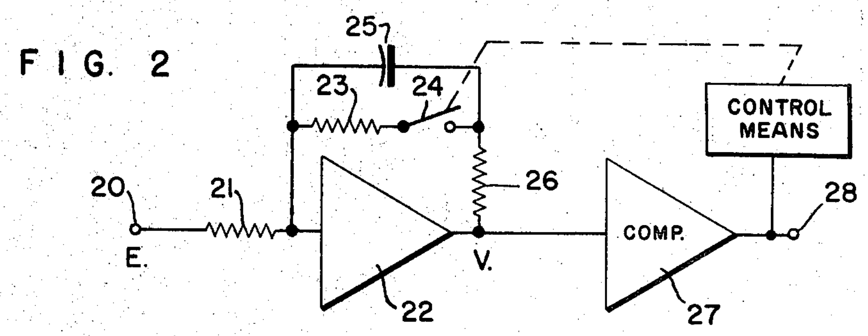
FIG. 2 is a schematic diagram of one embodiment of the instant invention.

Referring now to FIG. 2, there is shown a schematic diagram of a compensated voltage to frequency converter which uses a much smaller number of parts. In particular, an input terminal 20 is connected via coupling resistor 21 to the input of amplifier 22. The output of amplifier 22 is connected to the input of comparator 27 which has its output connected to output terminal 28. A feedback path connected between the output and input of amplifier 22 includes the series combination of resistor 26 and capacitor 25. A further series combination of resistor 23 and normally open switch 24 is connected in parallel with capacitor 25. The similarity of this portion of the circuit with the integrating amplifier circuit shown in FIG. 1 is apparent. However, resistor 26 is inserted in the feedback path. It should be noted, that the resistor 26 may be connected in series with capacitor 25 to form a parallel branch with resistor 23 and switch 24 rather than being connected to one node of the parallel combination noted supra. However, this connection tends to elongate the discharge time for capacitor 25 and may be undesirable.

In operation, an input signal E is supplied at terminal 20. This signal is applied via resistor 21 to amplifier 22. The output signal produced by amplifier 22 is designated as V. Comparator 27, as noted previously, exhibits a threshold voltage $V_0$ such that comparator 27 triggers when the signal V equals $V_0$. Thus, the time T at which V equals $V_0$ is designated as the integrating time for the circuit.

Figure 3:
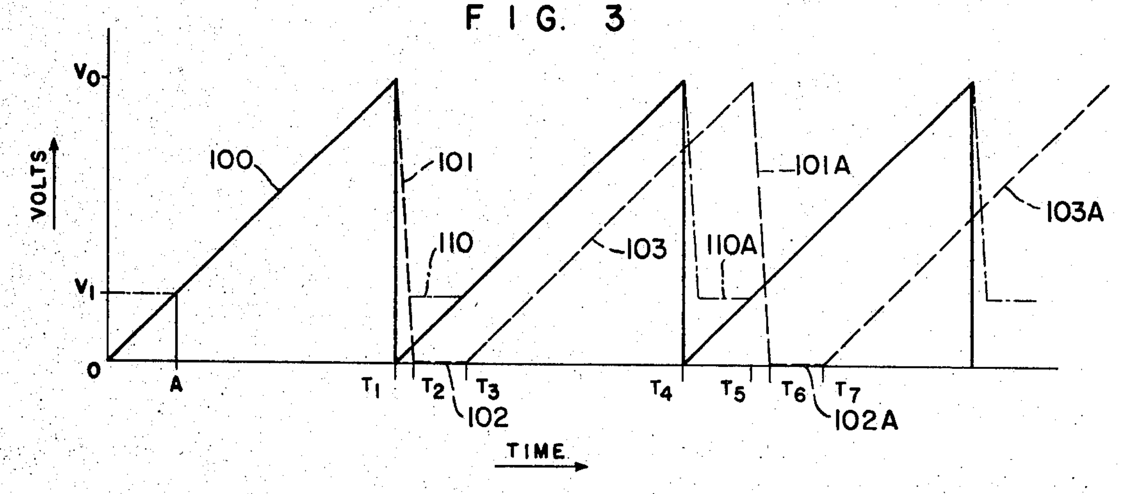
FIG. 3 is a representation of the output signals produced by the circuit shown in FIG. 2.

The operation of the circuit shown in FIG. 2 is described with concurrent reference to FIG. 3 wherein the waveforms for the circuit are shown. At time 0 the voltage across capacitor 25 is assumed to be zero. Solid line 100 shows the ramp waveform generated during ideal operation of the circuit. The voltage V at the output of amplifier 22 is defined by the equation $$V=\frac{(E)(R_{26})}{(R_{21})}+\frac{(E)(t)}{(R_{21})(C_{25})}$$

At time 0, the voltage V is defined as $V_1$ inasmuch as the application of input signal E to terminal 20 instantaneously causes feedback current through resistor 26. This feedback current produces a voltage drop $V_1$ across resistor 26. At time A the ideal ramp signal 100 intersects the $V_1$ value. Time A is equivalent to the time at which switch 24 opens and initiates integration by amplifier 22 and the attendant circuitry.

At time $T_1$ the output voltage V produced by amplifier 22 equals $V_0$ and the equation supra may be rewritten with the time factor *t* replaced by the factor $T_1$. Rewriting the equation and solving for $T_1$ produces $$T_1=\frac{(V_0)(R_{21})(C_{25})}{E}-(R_{26})(C_{25})$$

If the ideal situation is assumed as suggested by the solid line 100, at $T_1$ comparator 27 switches and closes switch 24 thereby discharging capacitor 25 and reinitiating the operation of amplifier 22 wherein the succeeding ramp signal is generated.

However, it is well known that a finite time is required to discharge capacitor 25. This finite time is a function of the values of capacitor 25 and resistor 23. The discharge time period is represented by $T_1$–$T_2$ and the actual signal formation is represented by dashed line 101. The integrator circuit conceivably could be ready to begin operation on the ramp signal immediately at time period $T_2$. However, as a practical matter switch 24 is normally maintained in the closed position for five to ten discharge time constants relative to capacitor 25 in order to assure that capacitor 25 is fully discharged and no residual charge remains thereon. Consequently, amplifier 22 is not readied for further integrating operation until time $T_3$. Thus, an error time designated by $T_1$–$T_3$ exists relative to the ideal circuit operation. Clearly, the actual ramp signal designated by dashed line 103 is significantly displaced from the solid line 100 and an error has been included in the circuit operation.

As will be seen at time period $T_4$ and $T_6$ the trailing edge of the ideal and actual signals continues to be progressively displaced by the "error" factors which are produced by the limitations of the actual circuitry as compared to the ideal circuitry. These error factors will persist and continue to cause the actual output signal to be significantly different from the ideal signal wherein a large error in the output signal is possible.

Returning to the discussion supra, it is noted that the period of the output signal is defined as $$\frac{1}{F}=T$$

where T is previously defined as the integrating time. However, from the discussion of the actual signal, it is apparent that the period of the circuit is $$\frac{1}{F}=T+T_0$$

where $T_0$ is the total offset or error time which is included in the circuit operation.

Substituting into the period equation, it is shown that $$\frac{1}{F}=T+T_0=\frac{(V_0)(R_{21})(C_{25})}{E}-(R_{26})(C_{25})+T_0$$

It is well known that in order to have linear circuit operation, frequency must be defined as $F=KE$. Inverting the period equation and equating it to the frequency equation, it is apparent that a linear circuit is obtained if and only if $T_0=R_{26}C_{25}$. Rearranging, it is clear that this equation is satisfied if and only if $$R_{26}=\frac{T_0}{C_{25}}$$

Thus, the value for resistor 26 is determined.

When switch 24 is closed at time $T_1$, capacitor 25 is discharged substantially to zero. (Practically, the discharge of capacitor 25 is limited to the level determined by the voltage drop across resistor 23.) It has been shown that the value of resistor 26 is a function of the time period $T_0$. Thus, the output signal V drops to a level equal to the voltage drop across resistor 26. This voltage level is indicated by the dot-dash lines 110 and 110A. Moreover, this voltage level is determined as the voltage level at which the total discharge time requirement and the idealized waveform 100 intersect. Consequently, when switch 24 reopens at time $T_3$ the circuit is prepared for integrating operation, the second pulse is contiguous with the waveshape for the ideal signal. Similar operations occur at times $T_4$ and so forth wherein the ramp portion of the signal follows the solid line 100 and the trailing edge and horizontal portion of the wave signal are represented by dot-dash line 110. A signal having an essentially truncated waveshape is thereby provided. However, this signal has the same frequency and is contiguous with the ideal frequency wherein a linear voltage to frequency converter is provided.

If the effect of resistor 23 is significant insofar as the residual signal on capacitor 25, resistors 23 and 26 may be lumped together in computing the pedestal voltage. That is, with switch 24 shorted, the current feedback path includes resistors 23 and 26. Thus, switch 24 is protected from burn-out and the proper pedestal voltage is provided.

Thus, there has been described an improved reset time compensator for a voltage to frequency converter which requires a minimum number of parts and expense. As noted, modification may be made to the preferred embodiment shown. However, any modifications which are included within the inventive concepts are intended to be included within the purview of this description.

The embodiments of the invention in which an exclusive property or privilege is claimed are defined as follows:

1. In combination, amplifier means, capacitor means having a capacitance C and connected in a feedback path between the output and the input of said amplifier means, switch means connected across said capacitor means to selectively short circuit said capacitor means, said capacitor means exhibiting a finite discharge time T when short circuited by said switch means, and resistance means connected in said feedback path to produce a voltage across said resistance means which is related to said finite discharge time of said capacitor means and substantially compensates therefor, said resistance means having a resistance R which is determined by the equation $$R=\frac{T}{C}$$

and having at least a portion connected in series with said capacitor means between said output and said input.

2. The combination recited in claim 1 including control means for selectively operating said switch means as a function of the output signal produced by said amplifier means.

3. The combination recited in claim 1 wherein a portion of said resistance means is a current limiting resistor connected in series with said switch means across said capacitor means.

References Cited

UNITED STATES PATENTS

| | | | |
|---|---|---|---|
| 3,350,574 | 10/1967 | James | 307—229X |
| 3,401,344 | 9/1968 | Andrus et al. | 307—229X |
| 3,419,784 | 12/1968 | Winn | 328—127X |
| 3,453,548 | 7/1969 | Paradise | 328—127X |

OTHER REFERENCES

"Analog Simulation" by Karplus, dated 1958, pages 230 to 237 relied on.

STANLEY D. MILLER, Jr., Primary Examiner

U.S. Cl. X.R.

307—229; 328—142, 184